(12) United States Patent
Imazaki et al.

(10) Patent No.: US 8,338,692 B2
(45) Date of Patent: Dec. 25, 2012

(54) ELECTROLYTE FOR PHOTOELECTRIC CONVERSION ELEMENTS, AND PHOTOELECTRIC CONVERSION ELEMENT AND DYE-SENSITIZED SOLAR CELL USING THE ELECTROLYTE

(75) Inventors: Yoshimasa Imazaki, Kanagawa (JP); Tsukasa Maruyama, Kanagawa (JP)

(73) Assignee: The Yokohama Rubber Co., Ltd., Tokyo (JP)

( * ) Notice: Subject to any disclaimer, the term of this patent is extended or adjusted under 35 U.S.C. 154(b) by 1 day.

(21) Appl. No.: 13/131,674

(22) PCT Filed: Nov. 26, 2009

(86) PCT No.: PCT/JP2009/069981
§ 371 (c)(1), (2), (4) Date: May 27, 2011

(87) PCT Pub. No.: WO2010/061901
PCT Pub. Date: Jun. 3, 2010

(65) Prior Publication Data
US 2011/0226315 A1    Sep. 22, 2011

(30) Foreign Application Priority Data

| Nov. 27, 2008 | (JP) | 2008-302935 |
| Dec. 8, 2008 | (JP) | 2008-312336 |
| Jul. 23, 2009 | (JP) | 2009-172351 |
| Nov. 26, 2009 | (JP) | 2010-513520 |

(51) Int. Cl.
*H01L 31/00* (2006.01)
*H01G 9/02* (2006.01)
*H01B 1/04* (2006.01)

(52) U.S. Cl. ......... 136/243; 252/62.2; 252/502

(58) Field of Classification Search ......... 136/252, 136/263, 243; 252/62.2, 502; 438/82
See application file for complete search history.

(56) References Cited

U.S. PATENT DOCUMENTS

| 2004/0238826 A1 | 12/2004 | Sekiguchi et al. |
| 2006/0174932 A1 | 8/2006 | Usui et al. |
| 2008/0115831 A1 * | 5/2008 | Kang et al. ........... 136/263 |
| 2009/0203164 A1 | 8/2009 | Kang et al. |

FOREIGN PATENT DOCUMENTS

| DE | 603 19 522 T2 | | 4/2009 |
| JP | 2007-227087 A | | 9/2007 |
| JP | 2007227087 | * | 9/2007 |
| JP | 2008-130537 A | | 6/2008 |
| JP | 2009-238693 A | | 10/2009 |
| WO | 2005/006482 A1 | | 1/2005 |

* cited by examiner

Primary Examiner — Ling Choi
Assistant Examiner — Monique Peets
(74) Attorney, Agent, or Firm — Carrier Blackman & Associates, P.C.; William D. Blackman; Joseph P. Carrier

(57) ABSTRACT

An object of the present invention is to provide an electrolyte for photoelectric conversion elements, and a photoelectric conversion element and a dye-sensitized solar cell using the electrolyte, wherein high energy conversion efficiency can be achieved while substantially not including iodine. The electrolyte for a photoelectric conversion element of the present invention includes an ionic liquid (A) and a carbon material (B) having a specific surface area of from 1,000 to 3,500 $m^2/g$, wherein a content of the carbon material (B) is from 10 to 50 parts by mass per 100 parts by mass of the ionic liquid (A).

15 Claims, 2 Drawing Sheets

ELECTROLYTE FOR PHOTOELECTRIC CONVERSION ELEMENTS, AND PHOTOELECTRIC CONVERSION ELEMENT AND DYE-SENSITIZED SOLAR CELL USING THE ELECTROLYTE

TECHNICAL FIELD

The present invention relates to an electrolyte for photoelectric conversion elements, and a photoelectric conversion element and a dye-sensitized solar cell using the electrolyte.

BACKGROUND ART

In recent years, environmental issues such as global warming and the like that are attributed to increases in carbon dioxide have become serious. As a result, non-silicon solar cells have gained attention as solar cells that have little environmental impact and that also allow for reduced manufacturing costs; and research and development of such is moving forward.

Among non-silicon solar cells, the dye-sensitized solar cell developed by Graetzel et al. in Switzerland has attracted attention as a new type of solar cell. As a solar cell using organic materials, these solar cells have advantages such as high photoelectric conversion efficiency and lower manufacturing costs than silicon solar cells.

However, dye-sensitized solar cells are electrochemical cells, and therefore use organic electrolytic solutions and/or ionic liquids as electrolytes. In cases where organic electrolytic solutions are used, there is a problem in that electrical efficiency decreases due to volitization and depletion during long-term use. Additionally, in cases where ionic liquids are used, while volitization and depletion that occur during long-term use can be prevented, there are durability problems such as structural degradation caused by liquid leakage.

Therefore, research is being conducted regarding converting the electrolyte from a liquid to a gel or solid for the purpose of preventing the volitization and liquid leakage of the electrolytic solution and ensuring the long-term stability and durability of the solar cell.

For example, Patent Document 1 describes an electrolyte composition including an ionic liquid and conductive particles as main components, wherein the electrolyte composition is made into a gel (Claims 1 and 2).

Additionally, Patent Document 2 describes a dye-sensitized photoelectric conversion element having a porous photoelectrode layer made from dye-sensitized semiconductor particles, a charge transport layer, and a counterelectrode layer in this order. The charge transport layer is made from a solid mixture including from 1 to 50 mass % of a p-type conductive polymer, from 5 to 50 mass % of a carbon material, and from 20 to 85 mass % of an ionic liquid (Claim 1).

However, in cases where the electrolyte composition described in Patent Document 1 is used, when a redox couple (particularly iodine) is used in order to achieve high energy conversion efficiency, there have been problems such as the metal wiring (collecting electrode), seal material, and the like that constitute the photoelectric conversion element being corroded due to the corrosive properties of the iodine; and the stability of the electrolyte being affected due to the volatility of the iodine.

PRIOR ART DOCUMENTS

Patent Documents

Patent Document 1: WO/2005/006482
Patent Document 2: Japanese Unexamined Patent Application Publication No. 2007-227087A

SUMMARY OF THE INVENTION

Problem To Be Solved By The Invention

Additionally, as a result of investigation into the dye-sensitized photoelectric conversion element described in Patent Document 2, the inventors discovered that energy conversion efficiency is not sufficient. Specifically, it is thought that when using a mixture of a p-type conducting polymer (e.g. polyaniline, polypyrrole, and the like), a carbon material (e.g. acetylene black, and the like), and an ionic liquid as a charge transport layer, the ability of the carbon material (particularly acetylene black) itself to retain the ionic liquid (retention capacity) is low and, moreover, said retention capacity is further decreased as a result of mixing with the p-type conducting polymer.

Therefore, an object of the present invention is to provide an electrolyte for a photoelectric conversion element, and a photoelectric conversion element and a dye-sensitized solar cell using the electrolyte, wherein high energy conversion efficiency can be achieved while substantially not including iodine.

Means To Solve The Problem

As a result of diligent research, the inventors discovered that an electrolyte for a photoelectric conversion element including an ionic liquid and a carbon material having a specific surface area of from 1,000 to 3,500 m$^2$/g at a specific ratio can achieve high energy conversion efficiency while substantially not including iodine, and thus arrived at the present invention.

Specifically, the present invention provides the following (a) to (o).

(a) An electrolyte for a photoelectric conversion element including an ionic liquid (A) and a carbon material (B) having a specific surface area of from 1,000 to 3,500 m$^2$/g, wherein a content of the carbon material (B) is from 10 to 50 parts by mass per 100 parts by mass of the ionic liquid (A).

(b) The electrolyte for a photoelectric conversion element described in (a), wherein a primary average particle size of the carbon material (B) is from 0.5 to 120 μm.

(c) The electrolyte for a photoelectric conversion element according to (a) or (b), wherein the ionic liquid (A) includes a cation that is expressed by the following Formula (1) or (2):

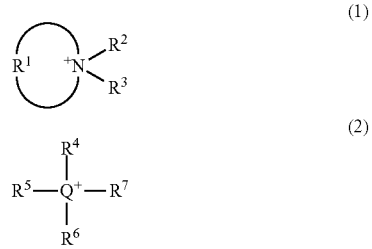

In Formula (1), R$^1$ is a hydrocarbon group having from 1 to 20 carbons that may include a hetero atom, and may include a substituent having 1 to 20 carbons that may include a hetero atom. R$^2$ and R$^3$ are each independently a hydrogen atom or a hydrocarbon group having from 1 to 20 carbon atoms, and may include a hetero atom. However, the R$^3$ moiety is absent if the nitrogen atom includes a double bond. In formula (2), Q is a nitrogen, oxygen, phosphorus, or sulfur atom; and R$^4$, R$^5$, R$^6$, and R$^7$ are each independently a hydrogen atom or a hydrocarbon group having 1 to 8 carbons that may include a heteroatom. However, the $R^7$ moiety is absent if Q is an oxygen or a sulfur atom.

(d) The electrolyte for a photoelectric conversion element described in (c), wherein the ionic liquid (A) includes iodine ions as anions.

(e) The electrolyte for a photoelectric conversion element described in any of (a) to (d), further including an acetylene black as another carbon material (C), aside from the carbon material (B).

(f) The electrolyte for a photoelectric conversion element described in (e), wherein the acetylene black is boron-modified acetylene black.

(g) The electrolyte for a photoelectric conversion element described in any of (a) to (f), further including a carbon material displaying a pH of from 2 to 6 as measured in accordance with pH measurement procedures stipulated in Japanese Industrial Standard (JIS) 28802 as another carbon material (C), aside from the carbon material (B).

(h) The electrolyte for a photoelectric conversion element described in (g), wherein a primary average particle size of the carbon material displaying a pH of from 2 to 6 is from 0.010 to 0.050 μm.

(i) The electrolyte for a photoelectric conversion element described in any of (a) to (h), further including a carbon black having a nitrogen specific surface area of not less than 90 $m^2/g$ as another carbon material (C), aside from the carbon material (B).

(j) The electrolyte for a photoelectric conversion element described in any one of (e) to (i), wherein a total content of the carbon material (B) and the other carbon material (C) is from 10 to 50 parts by mass per 100 parts by mass of the ionic liquid (A).

(k) The electrolyte for a photoelectric conversion element described in any of (e) to (j), wherein a ratio [carbon material (B)/other carbon material (C)] of the carbon material (B) to the other carbon material (C) is from 99.9/0.1 to 60/40.

(l) The electrolyte for a photoelectric conversion element described in any of (e) to (k) that is prepared by: obtaining a dispersion by mixing the ionic liquid (A) and the other carbon material (C), and then mixing in the carbon material (B).

(m) The electrolyte for a photoelectric conversion element described in any of (a) to (l) further including a silicon oxide and/or a metal oxide.

(n) A photoelectric conversion element including a photoelectrode including a transparent conductive film and a metal oxide semiconductor porous film;
a counterelectrode disposed opposite the photoelectrode; and
an electrolyte layer disposed between the photoelectrode and the counterelectrode, wherein
the electrolyte layer is the electrolyte for a photoelectric conversion element described in any of (a) to (m).

(o) A dye-sensitized solar cell including the photoelectrode described in (n) carrying a photosensitized dye.

Effect of the Invention

As described below, the present invention is useful for providing an electrolyte for a photoelectric conversion element, and a photoelectric conversion element and a dye-sensitized solar cell using the electrolyte, wherein high energy conversion efficiency can be achieved while substantially not including iodine.

Additionally, the electrolyte for a photoelectric conversion element is extremely useful as high energy conversion efficiency can be achieved without using a p-type conducting polymer such as polyaniline.

BRIEF DESCRIPTION OF THE DRAWINGS

FIG. 2 is a drawing illustrating a basic configuration of a solar cell of the present invention used in the Working Examples and the like.

DETAILED DESCRIPTION

Figure 1:
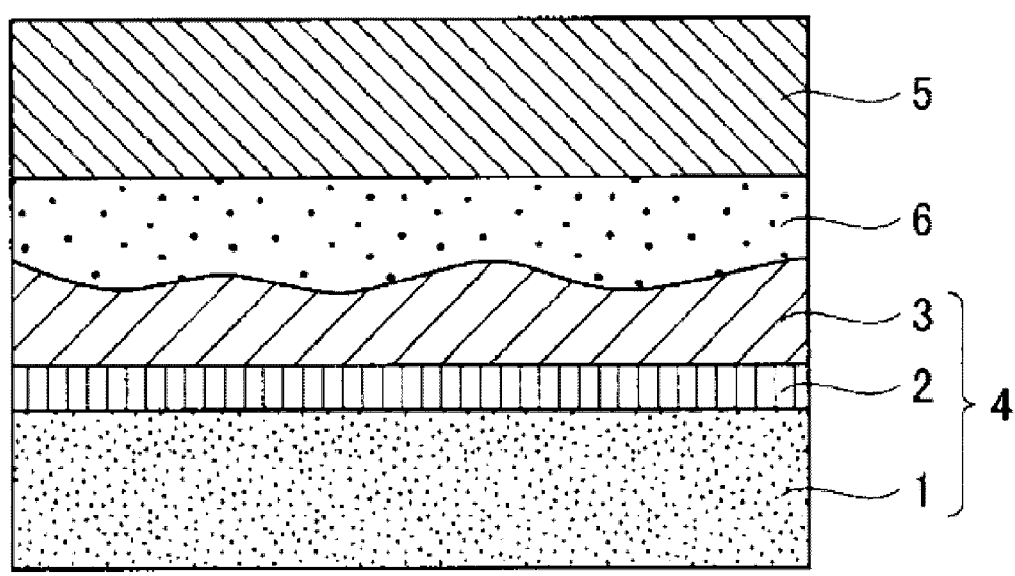
FIG. 1 is a schematic cross-sectional view illustrating an example of a basic configuration of a photoelectric conversion element of the present invention.

The present invention is explained in further detail below.

An electrolyte for a photoelectric conversion element of the present invention (hereinafter also referred to simply as "the electrolyte") includes an ionic liquid (A) and a carbon material (B) having a specific surface area of from 1,000 to 3,500 $m^2/g$. A content of the carbon material (B) is from 10 to 50 parts by mass per 100 parts by mass of the ionic liquid (A).

Next, each constituent of the electrolyte of the present invention will be described in detail.

Ionic Liquid (A)

The ionic liquid (A) for use in the electrolyte of the present invention is not particularly limited, and any ionic liquid conventionally used in an electrolyte can be used.

For example, a quaternary ammonium salt, an imidazolium salt, a pyridinium salt, a pyrrolidinium salt, a piperidinium salt, and the like described in, "Ionic Liquids: The Front and Future of Material Development", Hiroyuki OHNO, CMC Publishing, 2003; "Functional Creation and Applications of Ionic Liquids", Hiroyuki OHNO, NTS Publishing, 2004; and the like can be used.

The ionic liquid (A) includes cations and, as counterions thereto, anions.

Specific examples of preferred cations include the cations expressed by Formula (1) or (2) below.

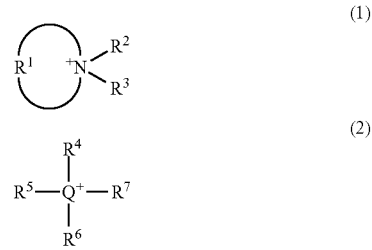

In Formula (1), $R^1$ is a hydrocarbon group having from 1 to 20 carbons that may include a hetero atom, and may include a substituent having 1 to 20 carbons that may include a hetero atom. $R^2$ and $R^3$ are each independently a hydrogen atom or a hydrocarbon group having from 1 to 20 carbon atoms, and may include a hetero atom. However, the $R^3$ moiety is absent if the nitrogen atom includes a double bond.

In formula (2), Q is a nitrogen, oxygen, phosphorus, or sulfur atom; and $R^4$, $R^5$, $R^6$, and $R^7$ are each independently a hydrogen atom or a hydrocarbon group having 1 to 8 carbons that may include a heteroatom. However, the $R^7$ moiety is absent if Q is an oxygen or a sulfur atom.

The hydrocarbon group in Formula (1) having from 1 to 20 carbons and that may include a hetero atom, $R^1$, preferably has a ring structure along with the nitrogen atom (ammonium ion) in Formula (1).

Next, preferable examples of the substituent, having from 1 to 20 carbons and that may include a hetero atom that $R^1$ in Formula (1) may include, include alkyl groups having from 1 to 12 carbons (e.g. a methyl group, an ethyl group, a propyl group, a butyl group, a pentyl group, a hexyl group, a heptyl group, an octyl group, and the like), alkoxy groups having from 1 to 12 carbons (e.g. a methoxy group, an ethoxy group, an n-propoxy group, an iso-propoxy group, an n-butoxy group, a tert-butoxy group, a sec-butoxy group, an n-pentoxy group, an n-hexoxy group, a 1,2-dimethylbutoxy group, and the like), and alkylalkoxy groups having from 2 to 12 carbons (e.g. a methoxymethylene group (—CH$_2$OCH$_3$), a methoxyethylene group (—CH$_2$CH$_2$OCH$_3$), an n-propylene-iso-propoxy group (—CH$_2$CH$_2$CH$_2$OCH(CH$_3$)$_2$), a methylene-t-butoxy group (—CH$_2$—O—C(CH$_3$)$_3$, and the like). Additionally, $R^1$ in Formula (1) may include two or more of these substituents.

Preferable specific examples of the hydrocarbon group, having from 1 to 20 carbons and that may include a hetero atom that $R^2$ and $R^3$ in Formula (1) may include, include alkyl groups having from 1 to 12 carbons (e.g. a methyl group, an ethyl group, a propyl group, a butyl group, a pentyl group, a hexyl group, a heptyl group, an octyl group, and the like), alkoxy groups having from 1 to 12 carbons (e.g. a methoxy group, an ethoxy group, an n-propoxy group, an iso-propoxy group, an n-butoxy group, a tert-butoxy group, a sec-butoxy group, an n-pentoxy group, an n-hexoxy group, a 1,2-dimethylbutoxy group, and the like), alkylalkoxy groups having from 2 to 12 carbons (e.g. a methoxymethylene group (—CH$_2$OCH$_3$), a methoxyethylene group (—CH$_2$CH$_2$OCH$_3$), an n-propylene-iso-propoxy group (—CH$_2$CH$_2$CH$_2$OCH(CH$_3$)$_2$), a methylene-t-butoxy group (—CH$_2$—O—C(CH$_3$)$_3$, and the like), and the like.

Additionally, preferable specific examples of the hydrocarbon group, having from 1 to 8 carbons and that may include a hetero atom, $R^4$, $R^5$, $R^6$, and $R^7$ in Formula (2) include alkyl groups having from 1 to 8 carbons (e.g. a methyl group, an ethyl group, a propyl group, a butyl group, a pentyl group, a hexyl group, a heptyl group, an octyl group, and the like), alkoxy groups having from 1 to 8 carbons (e.g. a methoxy group, an ethoxy group, an n-propoxy group, an iso-propoxy group, an n-butoxy group, a tert-butoxy group, a sec-butoxy group, an n-pentoxy group, an n-hexoxy group, a 1,2-dimethylbutoxy group, and the like), alkylalkoxy groups having from 2 to 8 carbons (e.g. a methoxymethylene group (—CH$_2$OCH$_3$), a methoxyethylene group (—CH$_2$CH$_2$OCH$_3$), an n-propylene-iso-propoxy group (—CH$_2$CH$_2$CH$_2$OCH(CH$_3$)$_2$), a methylene-t-butoxy group (—CH$_2$—O—C(CH$_3$)$_3$, and the like), and the like.

Examples of the cations expressed by Formula (1) include imidazolium ions, pyridinium ions, pyrrolidinium ions, piperidinium ions, and the like.

Specific examples of preferred cations include the cations expressed by any of Formulas (3) to (6) below.

Of these, the cations expressed by the following Formulas (3) and (5) are preferable because the photoelectric conversion efficiency of the photoelectric conversion element used in the electrolyte of the present invention (hereinafter also referred to as the "photoelectric conversion element of the present invention") tends to be better.

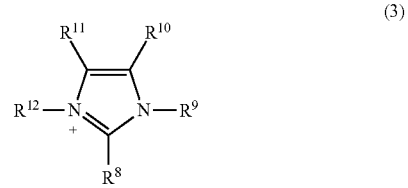

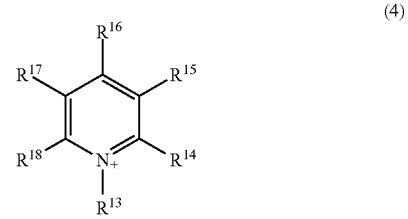

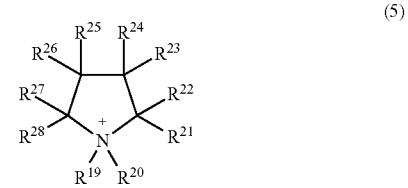

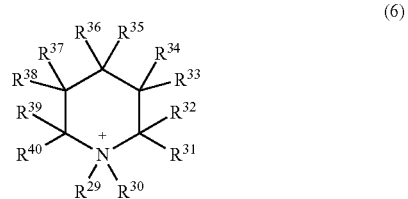

In Formulas (3) to (6), $R^8$ through $R^{40}$ are each independently a hydrocarbon group having from 1 to 20 carbons that may include a nitrogen atom.

More specific examples include the following cations.

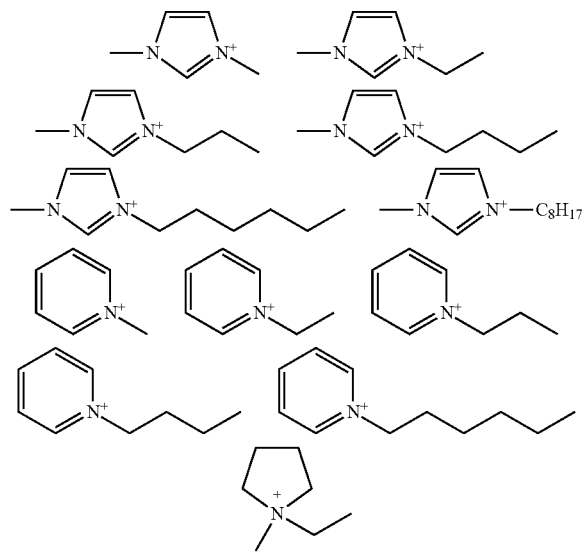

Examples of the cations of Formula (2) include organic cations such as ammonium ions, sulfonium ions, phosphonium ions, and the like.

Specific examples of preferable cations are listed below.

Of these, aliphatic quarternary ammonium ions are preferable because the photoelectric conversion efficiency of the photoelectric conversion element of the present invention tends to be better.

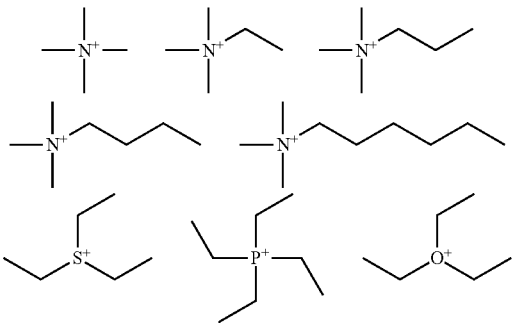

On the other hand, specific examples of preferable anions included in the ionic liquid (A) include I$^-$, Br$^-$, AlCl$_4^-$, Al$_2$Cl$_7^-$NO$_3^-$, $^-$, BF$_4^-$, PF$_6^-$, CH$_3$COO$^-$, CF$_3$COO$^-$, CF$_3$SO$_3^-$, (CN)$_4$B$^-$, SCN$^-$, (CF$_3$SO$_2$)$_2$N$^-$, (CN)$_2$N$^-$, (CF$_3$SO$_2$)$_3$C$^-$, (CN)$_3$C$^-$, AsF$_6^-$, SbF$_6^-$, F(HF)$_n^-$, CF$_3$CF$_2$CF$_2$SO$_3^-$, (CF$_3$CF$_2$SO$_2$)$_2$N$^-$, CF$_3$CF$_2$CF$_2$COO$^-$, and the like.

Of these, the anions are preferably bromine ions (Br$^-$) or iodine ions (I$^-$) and more preferably iodine ions (I$^-$) because the photoelectric conversion efficiency of the photoelectric conversion element of the present invention tends to be better.

Examples of the ionic liquid (A) include combinations and the like of the cations and anions described above.

Of these, the ionic liquid (A) is preferably an ionic liquid including imidazolium ions as the cations and iodine ions as the anions.

In the present invention, a synthesis method of the ionic liquid (A) is not particularly limited, and various types of ionic liquids obtained from combinations of the cations and the anions described above can be synthesized by a conventionally known method.

Synthesized products can be used such as 1-methyl-3-methyl imidazolium iodide, 1-ethyl-3-methyl imidazolium iodide, 1-methyl-3-pentyl imidazolium iodide, 1-hexyl-3-methyl imidazolium iodide, 1-((2-methoxyethoxy)ethyl)-3-((2-methoxyethoxy)ethyl)imidazolium iodide, and the like, and also commercially available products can be used. Specific examples of commercially available products that can be used include 1-methyl-3-propyl imidazolium iodide (manufactured by Tokyo Chemical Industry Co., Ltd.), 1-methyl-3-butyl imidazolium iodide (manufactured by Tokyo Chemical Industry Co., Ltd.), 1-methyl-1-methyl-pyrrolidinium iodide (manufactured by Sigma-Aldrich Co.), 1-ethyl-3-methylimidazolium tetracyanoborate (manufactured by Merck), 1-ethyl-3-methylimidazolium thiocyanate (manufactured by Merck), and the like.

In the present invention, a content of the ionic liquid (A) described above is preferably from 50 to 95 mass %, and more preferably from 65 to 95 mass % of a total mass of the electrolyte of the present invention. If the content is within this range, the photoelectric conversion efficiency of the photoelectric conversion element of the present invention will be better.

Carbon Material (B)

The carbon material (B) for use in the electrolyte of the present invention is a carbon material having a specific surface area of from 1,000 to 3500 m$^2$/g.

Here, "specific surface area" refers to a measurement taken using a nitrogen adsorption BET method in accordance with the method stipulated in JIS K1477.

In the present invention, from 10 to 50 parts by mass of the carbon material (B) per 100 parts by mass of the ionic liquid (A) are included. Therefore, high energy conversion efficiency can be achieved while substantially not including iodine.

This is thought to be because by using the carbon material (B) having a surface area larger than that of carbon black (acetylene black) or graphite, the carbon material (B) forms an electrolyte that sufficiently retains the ionic liquid (A), and a metal oxide semiconductor porous film, which is described below, can be sufficiently filled with the ionic liquid (A) from that electrolyte. Additionally, this also thought to be because the carbon material (B) having a large surface area has sponge-like functionality in that it can be filled and emptied of the ionic liquid (A). This results in suppression of the formation of localized layers of the ionic liquid (A) (ionic liquid layers) formed at each interface, specifically suppression of forming at an interface between the electrolyte and the metal oxide semiconductor porous film described below, an interface between carbon particles, and an interface between the electrolyte and the counterelectrode. Note that the ionic liquid (A) must be present in the electrolyte for the electrolyte to function as an electrolyte for a photoelectric conversion element. However, for example, in the dye-sensitized photoelectric conversion element described in Patent Document 2, it was discovered that the ionic liquid forms an ionic liquid layer that has low charge transport capacity between the interfaces described above. This ionic liquid layer may become a resistance component that leads to a decrease in photoelectric conversion efficiency.

Additionally, in order to enhance the filling of the metal oxide semiconductor porous film with the ionic liquid (A) and the sponge-like functionality described above, the content of the carbon material (B) is preferably from 15 to 45 parts by mass, and more preferably from 25 to 40 parts by mass, per 100 parts by mass of the ionic liquid (A).

Moreover, in the present invention, the specific surface area of the carbon material (B) is preferably from 1,100 to 3,200 m$^2$/g, and more preferably from 1,200 to 2,800 m$^2$/g. When the specific surface area is within this range, filling of the metal oxide semiconductor porous film with the ionic liquid (A) and the sponge-like functionality described above effectively function, and the photoelectric conversion efficiency of the photoelectric conversion element of the present invention will be better.

Furthermore, in the present invention, a primary average particle size of the carbon material (B) is preferably from 0.5 to 120 μm, and more preferably from 0.8 to 80 μm. When the primary average particle size is within this range, the photoelectric conversion efficiency of the photoelectric conversion element of the present invention will be better.

Here, "primary average particle size" refers to a measurement taken according to a conventional method for measuring the primary average particle size of a carbon material (e.g. activated charcoal or the like), and, in the present invention, refers to a 50% accumulated volume diameter (D50) measured by dispersing the carbon material (B) in a neutral detergent-containing aqueous solution and using a laser diffraction particle size distribution measurement device (e.g. the SALD2000J®, manufactured by Shimadzu Corporation).

Furthermore, in the present invention, an specific resistance of the carbon material (B) is preferably from $1 \times 10^{-4}$ to $5 \times 10^2$ Ω·cm, more preferably from $1 \times 10^{-2}$ to $1 \times 10^2$ Ω·cm, and even more preferably from $5 \times 10^{-2}$ to 50 Ω·cm. When the specific resistance is within this range, surface graphitization does not progress, and therefore a carbon material having excellent wettability with the ionic liquid (A) described above and high retention capacity of the ionic liquid (A) is obtained.

Here, "specific resistance" refers to a measurement of specific resistance (volume resistivity value) taken by a two-terminal measurement method with a low resistivity meter.

Note that a specific resistance of the acetylene black described below is $3 \times 10^{-2}$ Ω·cm.

Specific examples of such a carbon material (B) include activated charcoal (specific surface area: from 1,000 to 2,800 $m^2/g$, primary average particle size: from 0.5 to 120 μm, specific resistance: $1.0 \times 10^{-1}$ Ω·cm); a boron-containing porous carbon material (specific surface area: from 1,000 to 2,000 $m^2/g$, primary average particle size: from 0.5 to 100 μm, specific resistance: $1 \times 10^{-1}$ Ω·cm); a nitrogen-containing porous carbon material (specific surface area: from 1,000 to 2,000 $m^2/g$, primary average particle size: from 0.5 to 100 μm, specific resistance: $1 \times 10^{-1}$ Ω·cm); and the like. One of these may be used or alone, or two or more may be used in combination.

Of these, the activated charcoal is preferable because it is readily acquirable.

The activated charcoal is not particularly limited, and conventional activated charcoal particles that are used in carbon electrodes and the like can be used. Specific examples include activated charcoal particles formed by activating coconut shell, wood dust, petroleum pitch, phenolic resins, and the like using water vapor, various chemicals, alkali, and the like. One of these may be used or alone, or two or more may be used in combination.

Other Carbon Material (C)

The electrolyte of the present invention, in order to enhance the photoelectric conversion efficiency of the photoelectric conversion element of the present invention, can use one or more of acetylene black (C1), boron-modified acetylene black (C2), a carbon material (C3) displaying a pH of from 2 to 6 as measured in accordance with pH measurement procedures stipulated in Japanese Industrial Standard (JIS) Z8802, and a carbon black (C4) having a nitrogen specific surface area of not less than 90 $m^2/g$ as another carbon material (C).

Two or more of the other carbon materials (C) can be used in combination, and a combination of the below-described boron-modified acetylene black (C2) and the carbon material (C3) is preferably used.

Acetylene Black (C1)

The acetylene black (C1) that can be used in the electrolyte of the present invention is not particularly limited, and is a highly crystalline carbon black obtained via acetylene gas thermolysis. Any conventional acetylene black (C1) used as an agent for providing conductivity can be used.

Specific examples of such an acetylene black (C1) include acetylene black (DENKA BLACK powder, manufactured by Denki Kagaku Kogyo K.K., specific surface area: 68 $m^2/g$, primary average particle size: 400 nm, specific resistance: $3 \times 10^{-2}$ Ω·cm) and the like.

Boron-Modified Acetylene Black (C2)

The boron-modified acetylene black (C2) that can be used in the electrolyte of the present invention is not particularly limited, and specific examples thereof include boron-modified acetylene black (DENKA BLACK BMAB, manufactured by Denki Kagaku Kogyo K.K., specific surface area: 50 $m^2/g$, primary average particle size: 35 nm, specific resistance: $1 \times 10^{-2}$ Ω·cm) and the like.

Note that in the present invention, the photoelectric conversion efficiency of the photoelectric conversion element of the present invention will be better if the boron-modified acetylene black (C2) is used instead of the acetylene black (C1).

Carbon Material (C3)

The carbon material (C3) that can be used in the electrolyte of the present invention is a carbon material displaying a pH of from 2 to 6 as measured in accordance with the pH measurement procedures stipulated in Japanese Industrial Standard (JIS) Z8802.

The measurement of the pH is taken as described in detail below. First 5 g of a carbon material sample is measured into a beaker. 50 mL of water is added thereto and the water is heated to a boil. Then the heated dispersion is cooled to room temperature, and the carbon material is allowed to precipitate while at rest. Thereafter, the supernatant fluid is removed and the slurry is left behind. Then, an electrode of a glass electrode pH meter is inserted into the slurry and a measurement is taken in accordance with the pH measurement procedures stipulated in Japanese Industrial Standard (JIS) Z8802-1984.

Furthermore, in the present invention, a primary average particle size of the carbon material (C3) is preferably from 0.010 to 0.050 μm, and more preferably from 0.010 to 0.035 μm. When the primary average particle size is within this range, the photoelectric conversion efficiency of the photoelectric conversion element of the present invention will be better.

Here, "primary average particle size" refers to a value taken by a conventional method for measuring the primary average particle size of a carbon material (e.g. furnace carbon black and the like), and, in the present invention, refers to an arithmetic average diameter of carbon black particles calculated by observing using an electron microscope.

Examples of such a carbon material (C3) include an acidic carbon black having an attached or bonded acidic group such as a phenolic hydroxy group, a carboxy group, a quinone group, a lactone group, or the like; a pigment carbon black; a color carbon black; and the like. Such a carbon material (C3) may be used alone or in combinations of two or more.

Among these, acidic carbon black is preferable because it blends readily with the ionic liquid (A) described above and leads to an enhancement in the photoelectric conversion efficiency of the photoelectric conversion element of the present invention.

Here, the carbon black to which the hydroxy group is attached that is used for the acidic carbon black is not particularly limited, and a commonly used carbon black such as oil furnace black, gas furnace black, thermal black, channel black (gas black), and the like can be used.

Additionally, examples of a method used to attach the hydroxy group or the like include commonly performed ozone treatments, plasma treatments, liquid phase acidification treatments and the like, as well as methods such as that described in Japanese Unexamined Patent Application No. 2004-238311.

Additionally, examples of the acidic carbon black that can be used include a channel black (gas black) itself having multiple acidic groups (the phenolic hydroxy group, carboxy group, and the like described above) on a surface of the carbon black; and commercially available products. Specific examples of commercially available products include the following, all manufactured by Mitsubishi Chemical Corporation: #2200B, (pH: 3.5, primary average particle size: 0.018 μm), #1000 (pH: 3.5, primary average particle size: 0.018 μm), #970 (pH: 3.5, primary average particle size: 0.016 μm), MA77 (pH: 2.5, primary average particle size: 0.023 μm), MA7 (pH: 3, primary average particle size: 0.024 μm), MA8 (pH: 3, primary average particle size: 0.024 μm), MA11 (pH:

3.5, primary average particle size: 0.029 μm), MA100 (pH: 3.5, primary average particle size: 0.024 μm), MA100R (pH: 3.5, primary average particle size: 0.024 μm), MA100S (pH: 3.5, primary average particle size: 0.024 μm), MA230 (pH: 3, primary average particle size: 0.030 μm), MA200RB (pH: 3, primary average particle size: 0.030 μm), and MA14 (pH: 3, primary average particle size: 0.040 μm);

The following, all manufactured by Degussa Evonik Industries: Special Black 6 (pH: 2.5, primary average particle size: 17 nm), Special Black 5 (pH: 3.0, primary average particle size: 20 nm), Special Black 4 (pH: 3.0, primary average particle size: 25 nm), Special Black 4A (pH: 3.0, primary average particle size: 25 nm), Special Black 550 (pH: 2.8, primary average particle size: 25 nm), Special Black 100 (pH: 3.3, primary average particle size: 50 nm), Special Black 250 (pH: 3.1, primary average particle size: 56 nm), Special Black 350 (pH: 3.5, primary average particle size: 31 nm), Printex 150T (pH: 4.0, primary average particle size: 29 nm), Color Black FW1 (pH: 3.5, primary average particle size: 13 nm), Color Black FW18 (pH: 4.8, primary average particle size: 15 nm), Color Black FW285 (pH: 3.5, primary average particle size: 11 nm), Color Black S170 (pH: 4.5, primary average particle size: 17 nm), Color Black S160 (pH: 4.5, primary average particle size: 17 nm), Color Black FW200 (pH: 2.5, primary average particle size: 13 nm), Color Black FW2 (pH: 2.5, primary average particle size: 13 nm), and Color Black FW2V (pH: 2.5, primary average particle size: 13 nm);

The following, all manufactured by Tokai Carbon Co., Ltd.: TOKABLACK #8300F (pH: 5.0, primary average particle size: 16 nm) and TOKABLACK #8500F (pH: 5.5, primary average particle size: 14 nm); and the like.

One of these may be used alone, or two or more may be used in any combination.

Among these, those having a pH of from 3.0 to 5.5 are preferable because stability over time of the electrolyte for a photoelectric conversion element of the present invention will be enhanced and the photoelectric conversion efficiency of the photoelectric conversion element of the present invention will be better.

Carbon Black (C4)

The carbon black (C4) that can be used for the electrolyte of the present invention is not particularly limited so long as the nitrogen specific surface area is not less than 90 m$^2$/g.

Here, "nitrogen specific surface area" is an alternative characteristic of surface area that can be used in the adsorption of carbon black to the rubber molecules, and an amount of nitrogen adsorption to the surface of the carbon black is a measurement taken in accordance with JIS K6217-7:2008 (Section 7: Rubber Compounding Ingredients—Determination Of Multipoint Nitrogen Surface Area (NSA) And Statistical Thickness Surface Area (STSA)).

Additionally, in the present invention, a carbon black having a nitrogen specific surface area of from 90 to 200 m$^2$/g is preferably used and a carbon black having a nitrogen specific surface area of from 100 to 180 m$^2$/g is more preferably used because the photoelectric conversion efficiency of the photoelectric conversion element of the present invention will be better.

Furthermore, in the present invention, the carbon black (C4) is preferably a carbon black having a pH, measured in accordance with the measuring method stipulated in JIS 28802, from 7 to 13, and is more preferably a carbon black with a pH from 7 to 11.

The measurement of the pH is taken as described below, the same as with the carbon material (C3). First 5 g of a carbon black sample is measured into a beaker. 50 mL of water is added thereto and the water is heated to boiling. Then the heated dispersion is cooled to room temperature, and the carbon black is allowed to precipitate while at rest. Thereafter, the supernatant fluid is removed and the slurry is left behind. Then, an electrode of a glass electrode pH meter is inserted into the slurry and a measurement is taken in accordance with the pH measurement procedures stipulated in Japanese Industrial Standard (JIS) Z8802-1984.

A commercially available product can be used as such a carbon black (C4).

Specific examples include SAF (N134, nitrogen specific surface area: 151 m$^2$/g, pH: 7.3, manufactured by Cabot Japan K.K.), ISAF (N234, nitrogen specific surface area: 117 m$^2$/g, pH: 7.5, manufactured by Cabot Japan K.K.), ISAF (N220, nitrogen specific surface area: 119 m$^2$/g, pH: 7.5, manufactured by Cabot Japan K.K.), ISAF (N219, nitrogen specific surface area: 106 m$^2$/g, pH: 7.5, manufactured by Tokai Carbon Co., Ltd.), HAF (N339, nitrogen specific surface area: 93 m$^2$/g, pH: 7.5, manufactured by Tokai Carbon Co., Ltd.), and the like.

In the present invention, the primary average particle size of the carbon black (C4) is preferably from 5 to 30 nm, and more preferably from 5 to 25 nm. When the primary average particle size is within this range, photoelectric conversion efficiency of the photoelectric conversion element of the present invention will be better.

As described in relation to the carbon material (C3), here, "primary average particle size" refers to an arithmetic average diameter of carbon black particles calculated by observing using an electron microscope.

In the present invention, when including the other carbon material (C), because high energy conversion efficiency can be achieved while substantially not including iodine, preferably a total of from 10 to 50 parts by mass of the carbon material (B) and the other carbon material (C) is included per 100 parts by mass of the ionic liquid (A).

Additionally, likewise, a content ratio [carbon material (B)/other carbon material (C)] between the carbon material (B) and the other carbon material (C) is preferably from 99.9/0.1 to 60/40.

Here, "content" refers to a total content when two or more of the acetylene black (C1), the boron-modified acetylene black (C2), the carbon material (C3), and the carbon black (C4) are used as the other carbon material (C). When only one of these is used as the other carbon material (C), "content" refers to an individual content thereof.

Reasons why high energy conversion efficiency can be achieved while substantially not including iodine are not entirely clear, however, the following reasons are conceivable.

It is thought that of the other carbon materials (C), the acetylene black (C1) and the boron-modified acetylene black (C2) that have small surface areas, along with the carbon material (B) that cannot completely retain the ionic liquid (A), can contribute to the promotion of charge transfer. Particularly, it is thought that, affinity to the ionic liquid (A) increases and dispersion into the ionic liquid (A) is facilitated because the boron-modified acetylene black (C2) has affinity due to the introduction of boron, and that as a result it is possible to enhance the promotion of charge transfer over the effects obtained via use of the acetylene black (C1).

Additionally, it is thought that in the other carbon material (C), anions (e.g. carboxylate, phenolate and the like) derived from the acidic groups (the phenolic hydroxy group, carboxy group, and the like described above) that exist as functional groups on the surface of the carbon material, of the carbon material (C3) are interacting with the cations of the ionic liquid (A). Moreover, it is thought that affinity greater than that when using common carbon blacks or graphite is obtained due to the presence of the surface functional groups of the carbon material, and that this is a reason for the ease of dispersion into the ionic liquid (A).

Additionally, of the other carbon materials (C), as with the carbon material (B), the carbon black (C4), having a large nitrogen specific surface area, has sponge-like functionality whereby the ionic liquid (A) can be filled and emptied. Therefore, formation of localized layers of the ionic liquid (A) (ionic liquid layers) formed at each interface can be suppressed, specifically forming at an interface between the electrolyte and the metal oxide semiconductor porous film described below, an interface between carbon particles, and an interface between the electrolyte and the counterelectrode can be suppressed. Moreover, because a structure of the carbon black (C4) is advanced, electron conductivity is enhanced. For these reasons, it is thought that the open voltage of the photoelectric conversion element increased.

Note that "open voltage" refers to the voltage between terminals when current is not flowing into a power source terminal, and refers to a voltage measurement taken when current generated by light irradiation ceases to flow against bias voltage (voltage flowing in an opposite direction) when said bias voltage is applied to the electrode and the bias voltage is gradually increased (when a current value is zero).

Additionally, in the present invention, in order to enhance the filling of the metal oxide semiconductor porous film with the ionic liquid (A), and also enhance the sponge-like functionality and charge transfer described above, the total content of the carbon material (B) and the other carbon material (C) is preferably from 15 to 45 parts by mass and more preferably from 20 to 40 parts by mass per 100 parts by mass of the ionic liquid (A).

Furthermore, for the same reasons, the content ratio [carbon material (B)/other carbon material (C)] of the carbon material (B) to the other carbon material (C) is preferably from 99/1 to 65/35 and more preferably from 98/2 to 70/30.

The electrolyte of the present invention can include a silicon oxide and/or a metal oxide because the inclusion of such will lead to an enhancement of the photoelectric conversion efficiency of the photoelectric conversion element of the present invention.

This enhancement is thought to occur due to an improvement in the arrangement of the cations (e.g. imidazolium ions) included in the ionic liquid (A) and the resultant facilitated progression of electron transfer.

The silicon oxide that can be used in the electrolyte of the present invention is not particularly limited and any conventionally known product can be used.

Specific examples of the silicon oxide include fumed silica, calcined silica, precipitated silica, pulverized silica, molten silica, colloidal silica, and the like.

Examples of such silicon oxides that can be used include commercially available products, specifically Z1165MP (manufactured by Rodia), AEROSIL200 (manufactured by Degussa), AEROSIL300 (manufactured by Degussa), and the like.

On the other hand, the metal oxide that can be used in the electrolyte of the present invention is not particularly limited and any conventionally known product can be used.

Specific examples of the metal oxide include titanium oxide (titanium dioxide), tin oxide, zinc oxide, tungstic oxide, zirconium oxide, hafnium oxide, strontium oxide, vanadium oxide, niobium oxide, and the like. One of these may be used or alone, or two or more may be used in combination.

Among these, from the perspective of the level of photoelectric conversion ability, and the like, titanium oxide, zinc oxide, niobium oxide, tungstic oxide, and zirconium oxide are preferable.

In the present invention a total content of the silicon oxide and/or the metal oxide, the carbon material (B), and the optionally included other carbon material (C) is preferably from 10 to 50 parts by mass, more preferably from 15 to 45 parts by mass, and even more preferably from 20 to 40 parts by mass per 100 parts by mass of the ionic liquid (A).

When the total content of the silicon oxide and/or the metal oxide, the carbon material (B), and the optionally included other carbon material (C) is within this range, high energy conversion efficiency can be achieved while substantially not including iodine.

Furthermore, in the present invention, a content ratio [silicon oxide and the like/carbon material and the like] of the silicon oxide and/or the metal oxide (hereinafter "the silicon oxide and the like"), to the carbon material (B) and the optionally included other carbon material (C) (hereinafter, "the carbon material and the like") is preferably from 1/99 to 50/50 and more preferably from 2/98 to 40/60.

A redox couple can be added to the electrolyte of the present invention in order to enhance the photoelectric conversion efficiency of the photoelectric conversion element of the present invention.

Any conventional product commonly used for, or that can be used for, dye-sensitized solar cells may be used as the redox couple so long as the object of the present invention is not impaired.

For example, metal complexes such as ferrocyanate-ferricyanate, ferrocene-ferricinium salt; sulfur compounds of a disulphide compound and a mercapto compound; hydroquinone; quinone; and the like can be used. One of these may be used or alone, or two or more may be used in combination.

Additionally, an inorganic salt and/or an organic salt can be added to the electrolyte of the present invention in order to enhance short current of the photoelectric conversion element of the present invention.

Examples of the inorganic salt and/or organic salt include alkali metals, alkali earth metal salts, and the like, such as lithium iodide, sodium iodide, potassium iodide, magnesium iodide, calcium iodide, lithium trifluoroacetate, sodium trifluoroacetate, lithium thiocyanate, lithium tetrafluoroborate, lithium hexaphosphate, lithium perchlorate, lithium triflate, lithium bis(trifluoromethanesulphonyl)imide, and the like. One of these may be used alone, or two or more may be used in combination.

An added amount of the inorganic salt and/or organic salt is not particularly limited and may be a conventional amount so long as the object of the present invention is not inhibited.

Additionally, a pyridine and/or a benzimidazole can be added to the electrolyte of the present invention in order to enhance the open voltage of the photoelectric conversion element of the present invention.

Specific examples include alkylpyridines such as methylpyridine, ethylpyridine, propylpyridine, butylpyridine, and the like; alkylimidazoles such as methylimidazole, ethylimidazole, propylimidazole, and the like; alkylbenzimidazoles such as methylbenzimidazole ethylbenzimidazole, propylbenzimidazole, and the like; and the like. One of these may be used or alone, or two or more may be used in combination.

An added amount of the pyridine and/or the benzimidazole is not particularly limited and can be a conventional amount.

An organic vehicle may be added to the electrolyte of the present invention, and specific examples thereof include carbonate esters such as ethylene carbonate, propylene carbonate, and the like; ethers such as ethylene glycol dialkyl ether, propylene glycol dialkyl ether, and the like; alcohols such as ethylene glycol monoalkyl ether, propylene glycol monoalkyl ether, and the like; polyhydric alcohols such as ethylene glycol, propylene glycol, and the like; nitriles such as propionitrile, methoxypropionitrile, cyanoethyl ester, and the like; amides such as dimethylformamide, N-methylpyrrolidone, and the like; aprotic polar vehicles such as dimethyl sulfoxide, sulfolane, and the like; and the like. One of these may be used or alone, or two or more may be used in combination.

An added amount of the organic vehicle is not particularly limited and can be a conventional amount so long as the object of the present invention is not inhibited.

A manufacturing method of the electrolyte of the present invention is not particularly limited and can, for example, be manufactured by mixing the ionic liquid (A), the carbon material (B), the optionally included other carbon material (C), the silicon oxide, and/or the metal oxide, and the like, and then thoroughly mixing and uniformly dispersing (kneading) using a ball mill, sand mill, pigment disperser, grinder, ultrasonic disperser, homogenizer, planetary mixer, Hobart mixer, roll, kneader, or the like at room temperature or under heat (e.g. from 40 to 150° C.).

Here, as necessary, an organic solution (e.g. toluene or the like) can be mixed in with the mixture of the ionic liquid (A), the carbon material (B), the optionally included other carbon material (C), the silicon oxide, and/or the metal oxide, and the like. After the mixing, the organic solution may be removed by a distillation under vacuum method.

Additionally, when mixing the ionic liquid (A), the carbon material (B), the optionally included other carbon material (C), the silicon oxide, and/or the metal oxide, and the like, the carbon material (B) may be finely pulverized beforehand using a conventional pulverizer such as a ball mill, jet mill, or the like in order to thoroughly impregnate the ionic liquid (A) into the carbon material (B). Moreover, for the same purpose, the mixture of the ionic liquid (A), the carbon material (B), the optionally included other carbon material (C), the silicon oxide and/or the metal oxide, and the like may be subjected to reduced pressure treatment at room temperature or while being heated (e.g. from 40 to 150° C.)

In the present invention, when the other carbon material (C) is included, the electrolyte of the present invention is preferably manufactured and prepared by mixing in the carbon material (B) after obtaining a dispersion (e.g. a paste dispersion) by mixing the ionic liquid (A) and the other carbon material (C).

By preparing the electrolyte of the present invention according to such a method, the photoelectric conversion efficiency of the photoelectric conversion element of the present invention will be better. It is thought that this is due to the other carbon material (C) existing unevenly in the ionic liquid (A); and the carbon material (B) that cannot completely retain the ionic liquid (A), along with the acetylene black (C1) and the boron-modified acetylene black (C2), contributing to the promotion of charge transfer, and the interaction of the carbon material (C3) with the cations of the ionic liquid (A).

Next, the photoelectric conversion element and the dye-sensitized solar cell of the present invention will be described using FIG. 1. FIG. 1 is a schematic cross-sectional view illustrating an example of a basic configuration of a photoelectric conversion element of the present invention.

The photoelectric conversion element of the present invention includes a photoelectrode having a transparent conductive film and a metal oxide semiconductor porous film, a counterelectrode disposed so as to oppose the photoelectrode, and an electrolyte layer provided between the photoelectrode and the counterelectrode.

Photoelectrode

As illustrated in FIG. 1, the photoelectrode is, for example, constituted by a transparent plate 1, a transparent conductive film 2, and an oxide semiconductor porous film 3.

Here, the transparent plate 1 preferably has excellent optical transparency, and specific examples include, in addition to glass plates, resin plates (films) such as polystyrene, polyethylene, polypropylene, polyethylene terephthalate, polyethylene naphthalate, polycarbonate, polyphenylene sulfide, cyclic olefin polymer, polyether sulfone, polysulfone, polyetherimide, polyarylate, triacetylcellulose, methyl polymethacrylate, and the like.

Additionally, specific examples of the transparent conductive film 2 include conductive metal oxides such as tin oxide doped with antimony or fluorine, zinc oxide doped with aluminum or gallium, indium oxide doped with tin, and the like.

Moreover, a thickness of the transparent conductive film 2 is preferably from about 0.01 to 1.0 μm.

Furthermore, the method for providing the transparent conductive film 2 is not particularly limited, and examples thereof include coating methods, sputtering methods, vacuum deposition methods, spray pyrolysis methods, chemical vapor deposition (CVD) methods, sol-gel methods, and the like.

Next, the oxide semiconductor porous film 3 is obtained by applying a dispersion of oxide semiconductor particles on the transparent conductive film 2.

Specific examples of the oxide semiconductor particles include titanium oxide, tin oxide, zinc oxide, tungstic oxide, zirconium oxide, hafnium oxide, strontium oxide, vanadium oxide, niobium oxide, and the like. One of these may be used alone, or two or more may be used in combination.

The dispersion is obtained by mixing the oxide semiconductor particles and a carrier medium using a disperser such as a sand mill, bead mill, ball mill, three-roll mill, colloid mill, ultrasonic homogenizer, Henschel mixer, jet mill, or the like.

Additionally, the dispersion, after being obtained by mixing using the disperser and immediately prior to use (application), is preferably subjected to ultrasonic treatment using an ultrasonic homogenizer or the like. By performing the ultrasonic treatment immediately prior to use, the photoelectric conversion efficiency of the photoelectric conversion element of the present invention will be better. A reason for this is thought to be because the filling of the oxide semiconductor porous film, formed using the dispersion that has been subjected to ultrasonic treatment immediately prior to use, with the ionic liquid (A) is facilitated.

Furthermore, acetyl acetone, hydrochloric acid, nitric acid, surfactants, chelating agents, and the like may be added to the dispersion in order to prevent the oxide semiconductor particles in the dispersion from re-aggregating; and a polymeric or cellulose thickening agent such as polyethylene oxide, polyvinylalcohol, and the like may be added to increase the viscosity of the dispersion.

Examples of commercially available products that can be used as the dispersion include titanium oxide pastes SP100 and SP200 (both manufactured by Showa Denko K.K.), titanium dioxide paste Ti-Nanoxide T (manufactured by Solaronix S.A.), Ti-Nanoxide D (manufactured by Solaronix S.A.), Ti-Nanoxide T/SP (manufactured by Solaronix S.A.), Ti-Nanoxide D/SP (manufactured by Solaronix S.A.), titania coating paste PECC01 (manufactured by Peccell Technologies), titania particle paste PST-18NR (manufactured by Nikki Chemical Co., Ltd.), titania particle paste PST400C (manufactured by Nikki Chemical Co., Ltd.), and the like.

A conventional wet film forming method, for example, can be used as the method for applying the dispersion on the transparent conductive film.

Specific examples of the wet film forming method include screen printing methods, ink jet printing methods, roll coating methods, doctor blade methods, spincoating methods, spraying methods, and the like.

Additionally, after applying the dispersion on the transparent conductive film, a heat treatment, chemical treatment, plasma, or ozone treatment is preferably performed in order to enhance electric contact between the particles, enhance adhesion with the transparent conductive film, and enhance film strength.

A temperature of the heat treatment is preferably from 40° C. to 700° C. and more preferably from 40° C. to 650° C. Additionally, a duration of the heat treatment is not particularly limited, but is normally from about 10 seconds to 24 hours.

Specific examples of the chemical treatment include chemical plating using a titanium tetrachloride aqueous solution, chemisorption using a carboxylic acid derivative, electrochemical plating using a titanium trichloride aqueous solution, and the like.

Counterelectrode

As illustrated in FIG. 1, the counterelectrode is an electrode 5, disposed opposite a photoelectrode 4. For example, a metal plate, or a glass plate or a resin plate having a conductive film on a surface thereof, can be used.

Examples of metals that can be used as the metal plate include platinum, gold, silver, copper, aluminum, indium, titanium, and the like. Examples of resin plates that can be used include, in addition to the plate (film) exemplified by the transparent plate 1 that constitutes the photoelectrode 4, common resin plates that are non-transparent or have limited transparency.

Additionally, examples of the conductive film provided on the surface include conductive metal oxides and the like such as metals such as platinum, gold, silver, copper, aluminum, indium, titanium, and the like; carbon; tin oxide; tin oxides doped with antimony or fluorine; zinc oxide; zinc oxides doped with aluminum or gallium; indium oxides doped with tin; and the like. A thickness and a forming method of the conductive film are the same as for the transparent conductive film 2 that constitutes the photoelectrode 4.

In the present invention, an electrode having a conductive polymeric film formed on a plate or a conductive polymeric film electrode can be used as a counterelectrode 5.

Specific examples of the conductive polymer include polythiophene, polypyrrole, polyaniline, and the like.

Examples of a method for forming the conductive polymeric film on the plate include a method in which a conductive polymeric film from a polymeric dispersion is formed on a plate using a conventionally known wet film forming method such as a dipping method or a spin coating method.

Examples of products that can be used as the conductive polymeric dispersion include a polyaniline dispersion described in Japanese Unexamined Patent Application No. 2006-169291, commercially available products such as a polythiophene derivative aqueous dispersion (Baytron P, manufactured by Bayer), Aquasave (manufactured by Mitsubishi Rayon, polyaniline derivative aqueous solution), and the like.

Additionally, when the plate is the conductive plate, in addition to the method described above, the conductive polymeric film can also be formed on the plate via an electrolysis polymerization method. The conductive polymeric film electrode can use a self-standing film wherein the conductive polymeric film formed on the electrode by the electrolysis polymerization method is peeled from the electrode, or a self-standing film formed using a casting method, a spin coating method, or the like that is conventionally known as a wet film forming method for forming a film from a conductive polymeric dispersion. Here, for convenience, a mixture of a state in which conductive polymeric particles are dispersed throughout the vehicle and a state in which conductive polymers are dissolved in the vehicle is referred to as the "conductive polymeric dispersion."

Electrolyte

As illustrated in FIG. 1, the electrolyte layer is an electrolyte layer 6 that is provided between the photoelectrode 4 and the counterelectrode 5. The electrolyte of the present invention described above is used in the photoelectric conversion element of the present invention.

The photoelectric conversion element of the present invention can achieve high energy conversion efficiency while substantially not including iodine because the electrolyte of the present invention described above is used.

The dye-sensitized solar cell of the present invention is a type of photoelectric conversion element wherein the photoelectrode constituting the photoelectric conversion element of the present invention described above carries a photosensitized dye.

Here, the photosensitized dye is not particularly limited so long as it is a dye having absorption in the visible light spectrum and/or infrared light spectrum, and a metal complex or an organic dye, or the like, can be used.

Specific examples of the photosensitized dye that can be used include ruthenium complex dyes in which a ligand such as a bipyridine structure, a terbipyridine structure, or the like is coordinated, porphyrin-based dyes, phthalocyanine-based dyes, cyanin-based dyes, melocyanine-based dyes, xanthen-based dyes, and the like. A method for applying the photosensitized dye is not particularly limited and, for example, can be applied by dissolving the dye described above in, for example, water or an alcohol, and then immersing the oxide semiconductor porous film 3 in the dye solution or coating the dye solution on the oxide semiconductor porous film 3.

EXAMPLES

The present invention will now be described in greater detail using the following examples, but is in no way limited to these examples.

Working Examples 1 to 34 and Comparative Examples 1 to 11

Preparation of the Electrolyte

An ionic liquid A1 and the like shown in Table 1 below, toluene, and zirconia beads (diameter: 3 mm) were blended for 60 minutes in a 30 mL mixing container according to the compositions shown in Table 1 using a bead mill (Rocking RM02, manufactured by Seiwa Giken Co., Ltd.).

An electrolyte was obtained by distilling off the toluene in vacuo from the dispersion after blending.

Fabrication of the Dye-Sensitized Solar Cell

A titanium oxide paste (Ti-Nanoxide D, manufactured by Solaronix) was coated on transparent conductive glass (FTO glass, surface resistance: 15 Ω/square, manufactured by Nippon Sheet Glass Co., Ltd.) and dried at room temperature, and thereafter was sintered for 30 minutes at a temperature of 450° C. Thereby, a photoelectrode having a titanium oxide porous film formed on transparent conductive glass was fabricated.

The fabricated photoelectrode was then immersed for four hours in a ruthenium complex dye (cis-(dithiocyanate)-N,N'-bis(2,2'-bipyridyl-4,4'-dicarboxylic acid)ruthenium(II)complex) (Ruthenium 535-bis TBA, manufactured by Solaronix) ethanol solution (concentration: $3\times10^{-4}$ mol/L).

Thereafter, the product was washed using acetonitrile and dried in a dark location under a stream of nitrogen. Thus a photoelectrode carrying a photosensitized dye in a titanium oxide electrode of a photoelectrode was used as the photoelectrode.

The prepared electrolyte was applied on the photoelectrode carrying the photosensitized dye, and this and a platinum counterelectrode formed by forming a platinum film having a thickness of about 100 nm on a surface of a transparent conductive glass plate using a sputtering method (indium oxide doped with tin on a conductive face, sheet resistance: 8 Ω/square, manufactured by Nippon Sheet Glass Co., Ltd.) were aligned and then bonded together using a clip, and thus the dye-sensitized solar cell was obtained.

The photoelectric conversion efficiency of the obtained dye-sensitized solar cell was measured and evaluated according to the method described below. The results are shown in Table 1.

Photoelectric Conversion Efficiency

Figure 2:
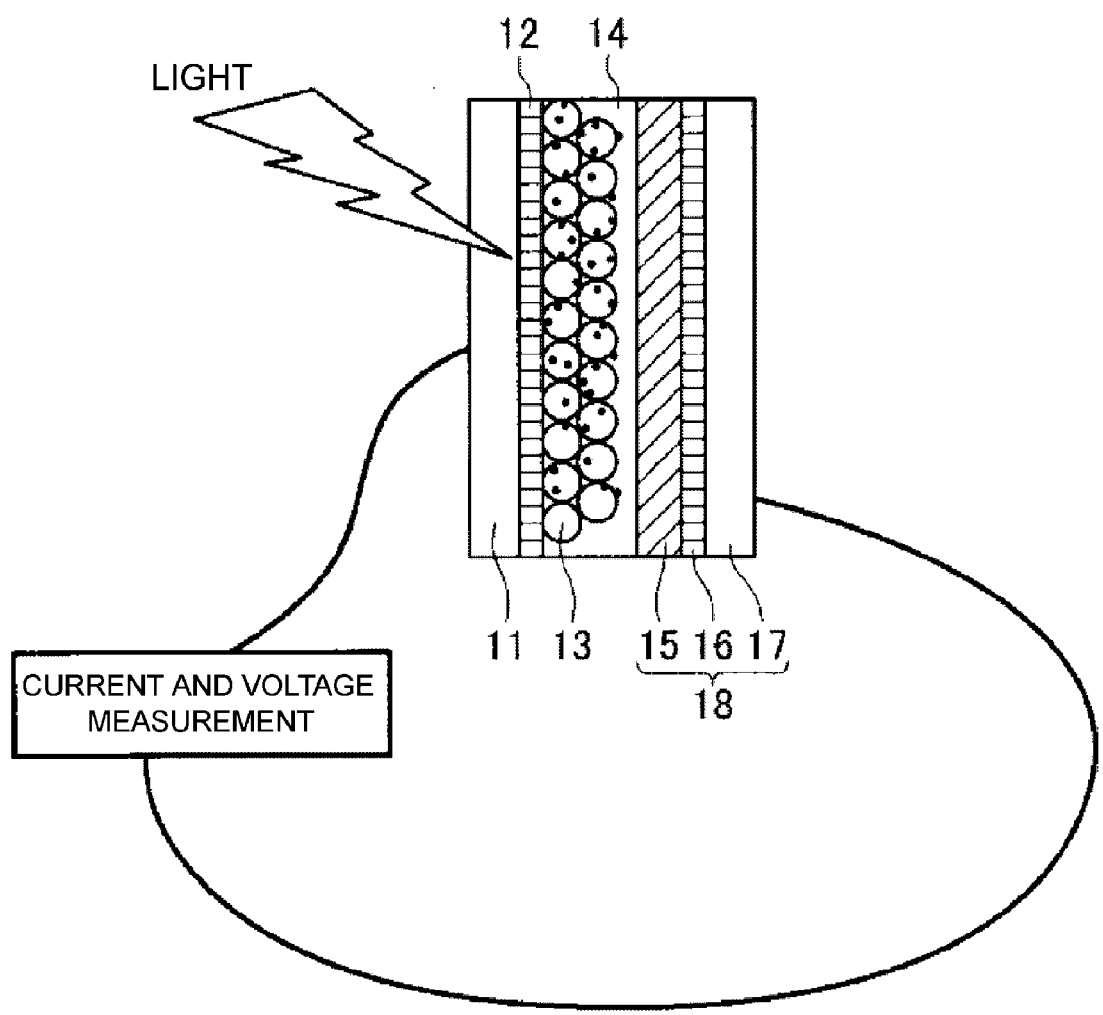

As illustrated in FIG. 2, a solar simulator is used as a light source, the photoelectrode side was irradiated with AM 1.5 artificial sunlight at a light intensity of 100 mW/cm², and the conversion efficiency was calculated using a DC/AC measuring device (Digital SourceMeter 2400, manufactured by Keithley Instruments Inc.).

TABLE 1

| | Working Examples | | | | |
|---|---|---|---|---|---|
| | 1 | 2 | 3 | 4 | 5 |
| Ionic liquid A1 | 100 | 100 | 100 | 100 | 100 |
| Carbon material B1 | 10 | 20 | 30 | 40 | 50 |
| Photoelectric conversion efficiency (%) | 4.3 | 4.6 | 4.9 | 4.7 | 4.5 |

| | Working Examples | | | | | | | | | | | | |
|---|---|---|---|---|---|---|---|---|---|---|---|---|---|
| | 6 | 7 | 8 | 9 | 10 | 11 | 12 | 13 | 14 | 15 | 16 | 17 | 18 |
| Ionic liquid A1 | 100.0 | 100.0 | 100.0 | 100.0 | 100.0 | 100.0 | 100.0 | 100.0 | 100.0 | 100.0 | 100.0 | 100.0 | 100.0 |
| Carbon material B2 | 10.0 | 19.0 | 29.5 | 28.5 | 28.5 | 23.0 | 18.0 | 39.5 | 38.0 | 38.0 | 31.0 | 24.0 | 47.5 |
| Carbon material C1-1 | 0.5 | 1.0 | 0.5 | 1.5 | 0.0 | 7.0 | 12.0 | 0.5 | 2.0 | 0.0 | 9.0 | 16.0 | 2.5 |
| Carbon material C2-1 | 0.0 | 0.0 | 0.0 | 0.0 | 1.5 | 0.0 | 0.0 | 0.0 | 0.0 | 2.0 | 0.0 | 0.0 | 0.0 |
| Carbon material B + Carbon material C | 10.5 | 20.0 | 30.0 | 30.0 | 30.0 | 30.0 | 30.0 | 40.0 | 40.0 | 40.0 | 40.0 | 40.0 | 50.0 |
| Carbon material B/Carbon material C | 95.3/4.7 | 95/5 | 98.3/1.7 | 95/5 | 95/5 | 76.7/23.3 | 60/40 | 98.8/1.2 | 95/5 | 95/5 | 77.5/2.5 | 60/40 | 95/5 |
| Photoelectric conversion efficiency (%) | 5.0 | 5.1 | 5.5 | 5.7 | 6.1 | 5.3 | 5.2 | 5.2 | 5.5 | 6.0 | 5.4 | 5.1 | 5.0 |

| | Working Examples | | | | | | | | | |
|---|---|---|---|---|---|---|---|---|---|---|
| | 19 | 20 | 21 | 22 | 23 | 24 | 25 | 26 | 27 | 28 |
| Ionic liquid A1 | 100.0 | 100.0 | 100.0 | 100.0 | 100.0 | 100.0 | 100.0 | 100.0 | 100.0 | 100.0 |
| Carbon material B2 | 10.0 | 20.0 | 30.0 | 40.0 | 45.0 | 10.0 | 10.0 | 26.0 | 30.0 | 30.0 |
| Carbon material C2-1 | 0.0 | 0.0 | 0.0 | 0.0 | 0.0 | 0.0 | 0.0 | 2.0 | 0.0 | 0.0 |
| Carbon material C3-1 | 0.5 | 1.0 | 1.5 | 2.0 | 2.3 | 20.0 | 30.0 | 2.0 | 0.0 | 0.0 |
| Carbon material C3-2 | 0.0 | 0.0 | 0.0 | 0.0 | 0.0 | 0.0 | 0.0 | 0.0 | 1.5 | 0.0 |
| Carbon material C3-3 | 0.0 | 0.0 | 0.0 | 0.0 | 0.0 | 0.0 | 0.0 | 0.0 | 0.0 | 1.5 |
| Carbon material B + Carbon material C | 10.5 | 21.0 | 31.5 | 42.0 | 47.3 | 30.0 | 40.0 | 30.0 | 31.5 | 31.5 |
| Carbon material B/Carbon material C | 95.3/4.7 | 95.3/4.7 | 95.3/4.7 | 95.3/4.7 | 95.3/4.7 | 33.3/66.7 | 25/75 | 86.7/13.3 | 95.3/4.7 | 95.3/4.7 |
| Photoelectric conversion efficiency (%) | 5.5 | 5.8 | 6.1 | 5.9 | 5.6 | 5.6 | 5.5 | 6.3 | 6.0 | 5.9 |

TABLE 1-continued

|  | Working Examples | | | |
|---|---|---|---|---|
|  | 29 | 30 | 31 | 32 |
| Ionic liquid A1 | 100.0 | 100.0 | 100.0 | 100.0 |
| Carbon material B2 | 10.0 | 40.0 | 40.0 | 40.0 |
| Carbon material C4-1 | 20.0 | 2.0 | 0.0 | 0.0 |
| Carbon material C4-2 | 0.0 | 0.0 | 2.0 | 0.0 |
| Carbon material C4-3 | 0.0 | 0.0 | 0.0 | 2.0 |
| Carbon material B + Carbon material C | 30.0 | 42.0 | 42.0 | 42.0 |
| Carbon material B/Carbon material C | 33.3/66.7 | 95.3/4.7 | 95.3/4.7 | 95.3/4.7 |
| Photoelectric conversion efficiency (%) | 5.2 | 5.6 | 5.6 | 5.6 |

|  | Working Examples | |
|---|---|---|
|  | 33 | 34 |
| Ionic liquid A1 | 100.0 | 100.0 |
| Carbon material B2 | 28.5 | 28.5 |
| Carbon material C1-1 | 1.5 | 1.5 |
| Silicon oxide | 3.5 | 0.0 |
| Titanium oxide | 0.0 | 3.5 |
| Photoelectric conversion efficiency (%) | 6.0 | 5.9 |

|  | Comparative Examples | | | | | | | | | | |
|---|---|---|---|---|---|---|---|---|---|---|---|
|  | 1 | 2 | 3 | 4 | 5 | 6 | 7 | 8 | 9 | 10 | 11 |
| Ionic liquid A1 | 100.0 | 100.0 | 100.0 | 100.0 | 100.0 | 100.0 | 100.0 | 100.0 | 100.0 | 100.0 | 100.0 |
| Carbon material B1 | 5.0 | 60.0 | 0.0 | 0.0 | 0.0 | 0.0 | 0.0 | 5.0 | 5.0 | 5.0 | 0.0 |
| Carbon material B2 | 0.0 | 0.0 | 0.0 | 0.0 | 0.0 | 0.0 | 0.0 | 0.00 | 0.0 | 0.0 | 5.0 |
| Carbon material C1-1 | 0.0 | 0.0 | 5.0 | 10.0 | 20.0 | 30.0 | 40.0 | 5.00 | 10.0 | 0.0 | 0.0 |
| Carbon material C3-1 | 0.0 | 0.0 | 0.0 | 0.0 | 0.0 | 0.0 | 0.0 | 0.0 | 0.0 | 5.00 | 10.0 |
| Carbon material B + Carbon material C | 5.0 | 60.0 | 5.0 | 10.0 | 20.0 | 30.0 | 40.0 | 10.0 | 15.0 | 10.00 | 15.0 |
| Carbon material B/Carbon material C | 100/0 | 100/0 | 0/100 | 0/100 | 0/100 | 0/100 | 0/100 | 50/50 | 33.3/66.7 | 50/50 | 33.3/66.7 |
| Photoelectric conversion efficiency (%) | 3.8 | 3.7 | 1.2 | 3.1 | 3.0 | 3.6 | 3.8 | 3.8 | 3.9 | 4.1 | 3.9 |

The components listed in Table 1 are described below.

Ionic liquid A1: 1-methyl-3-propyl imidazolium iodide (manufactured by Tokyo Chemical Industry Co., Ltd.)

Carbon material B1: Activated charcoal (NY1151, specific surface area: 1325 m²/g, primary average particle size: 5 μm, specific resistance: $1.5 \times 10^{-1}$ Ω·cm, manufactured by Kuraray Chemical)

Carbon material B2: Activated charcoal (NK261, specific surface area: 2300 m²/g, primary average particle size: 5 μm, specific resistance: $1.5 \times 10^{-1}$ Ω·cm, manufactured by Kuraray Chemical)

Carbon material C1-1: Acetylene black (DENKA BLACK powder, specific surface area: 68 m²/g, primary average particle size: 35 nm, specific resistance: $3 \times 10^{-2}$ Ω·cm, manufactured by Denki Kagaku Kogyo K.K.)

Carbon material C2-1: Boron-modified acetylene black (DENKA BLACK BMAB, specific surface area: 50 m²/g, primary average particle size: 35 nm, specific resistance: $1 \times 10^{-2}$ Ω·cm, manufactured by Denki Kagaku Kogyo K.K)

Carbon material C3-1: Acidic carbon black (Color Black FW1, pH: 4.5, primary average particle size: 13 nm, specific resistance: $5 \times 10^{-1}$ Ω·cm, manufactured by Degussa)

Carbon material C3-2: Special Black 5 (pH: 3.0, primary average particle size: 20 nm, specific resistance: 1.5 Ω·cm, manufactured by Degussa)

Carbon material C3-3: TOKABLACK #8500F (pH: 5.5, primary average particle size: 14 nm, specific resistance: $5 \times 10^{-1}$ Ω·cm, manufactured by Tokai Carbon Co., Ltd.)

Carbon material C4-1: SAF (N134, nitrogen specific surface area: 151 m²/g, pH: 7.3, average particle size: 19 nm, manufactured by Cabot Japan K.K.)

Carbon material C4-2: ISAF (N234, nitrogen specific surface area: 117 m²/g, pH: 7.5, average particle size: 23 nm, manufactured by Cabot Japan K.K.)

Carbon material C4-3: HAF (N339, nitrogen specific surface area: 93 m²/g, pH: 7.5, average particle size: 24 nm, manufactured by Tokai Carbon Co., Ltd.)

Silicon oxide: Precipitated silica (Z1165MP, manufactured by Rhodia)

Titanium oxide: Fumed titanium oxide P25 (manufactured by Degussa)

As is clear from the results shown in Table 1, the electrolytes of Working Examples 1 to 5 that were prepared having a specific ratio of the ionic liquid (A) to the carbon material (B) achieved a sufficiently high photoelectric conversion efficiency of from 4.3 to 4.9% while substantially not including iodine. This unexpected result shows that the electrolytes prepared in Working Examples 1 to 5 are superior to the electrolytes prepared in Comparative Examples 3 to 7, in which acetylene black, an electrically conductive material, was used.

On the other hand, it was found that the photoelectric conversion efficiencies of the electrolyte of Comparison Example 1 that was prepared by compounding 5 parts by mass of the carbon material (B) per 100 parts by mass of the ionic liquid (A) and the electrolyte of Comparison Example 2 that was prepared by compounding 60 parts by mass of the carbon material (B) per 100 parts by mass of the ionic liquid (A) were low.

Additionally, even when using the other carbon material (C), with the electrolytes of Comparative Examples 8 to 11 that were outside the content range of 10 to 50 parts by mass of the carbon material (B) per 100 parts by mass of the ionic liquid (A), even when the total content of the carbon material (B) and the other carbon material (C) was from 10 to 50 parts by mass, the photoelectric conversion efficiency was stagnant at around 4.0%.

In contrast, with the electrolytes of Working Examples 6 to 32 that were prepared so as to include the ionic liquid (A) and the carbon material (B) at a specific ratio and, furthermore, include the other carbon material (C), it was found that the photoelectric conversion efficiency increased sufficiently to not less than 5.0% while substantially not including iodine.

Particularly, with the electrolytes of Working Examples 10 and 15 that were prepared using boron-modified acetylene black as the other carbon material (C), it was found that the photoelectric conversion efficiency increased even more to not less than 6.0% while substantially not including iodine; and with the electrolytes of Working Examples 19 to 28 that were prepared using acidic carbon black as the other carbon material (C), it was found that the photoelectric conversion efficiency increased sufficiently to not less than 5.5% while substantially not including iodine.

Note that in each the electrolytes of Working Examples 6 to 32 the total content of the carbon material (B) and the other carbon material (C) was from 10 to 50 parts by mass per 100 parts by mass of the ionic liquid (A). However, a tendency was found for the photoelectric conversion efficiency to be higher with the electrolytes of Working Examples 6 to 23, 26 to 28, and 30 to 32 in which the content ratio [carbon material (B)/other carbon material (C)] of the carbon material (B) to the other carbon material (C) was from 99.9/0.1 to 60/40.

Additionally, with the electrolytes of Working Examples 33 and 34 that were prepared so as to include the ionic liquid (A) and the carbon material (B) at a specific ratio and, furthermore, include the silicon oxide or titanium oxide, it was found that the photoelectric conversion efficiency increased sufficiently to not less than 5.9% while substantially not including iodine.

REFERENCE NUMERALS

1: Transparent plate
2: Transparent conductive film
3: Oxide semiconductor porous film
4: Photoelectrode
5: Counterelectrode
6: Electrolyte layer
11: Transparent plate
12: Transparent conductive film (ITO, FTO)
13: Metal oxide
14: Electrolyte
15: Platinum film
16: Transparent conductive film (ITO, FTO)
17: Plate
18: Counterelectrode

What is claimed is:

1. An electrolyte for a photoelectric conversion element comprising an ionic liquid (A), and a carbon material (B) having a specific surface area of from 1,000 to 3,500 m²/g, and another carbon material (C) aside from the carbon material (B),
wherein
a content of the carbon material (B) is from 10 to 50 parts by mass per 100 parts by mass of the ionic liquid (A), the other carbon material (C) is at least one member selected from the group consisting of an acetylene black, a boron-modified acetylene black, a carbon material displaying a pH of from 2 to 6 as measured in accordance with pH measurement procedures stipulated in JIS Z8802 and a carbon black having a nitrogen specific surface area of not less than 90 m²/g, and
a ratio of the carbon material (B) to the other carbon material (C) is from 99.9/0.1 to 60/40.

2. The electrolyte for a photoelectric conversion element according to claim 1, wherein a primary average particle size of the carbon material (B) is from 0.5 to 120 µm.

3. The electrolyte for a photoelectric conversion element according to claim 1, wherein the ionic liquid (A) comprises a cation that is expressed by the following Formula (1) or (2):

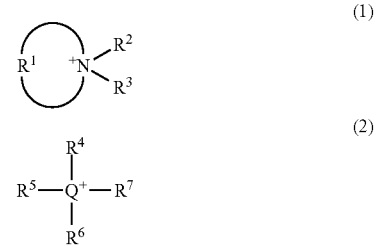

(in Formula (1), $R^1$ is a hydrocarbon group having from 1 to 20 carbons that may include a hetero atom, and may include a substituent having 1 to 20 carbons that may include a hetero atom; $R^2$ and $R^3$ are each independently a hydrogen atom or a hydrocarbon group having from 1 to 20 carbon atoms, and may include a hetero atom; however, the $R^3$ moiety is absent if the nitrogen atom includes a double bond; in formula (2), Q is a nitrogen, oxygen, phosphorus, or sulfur atom; and $R^4$, $R^5$, $R^6$, and $R^7$ are each independently a hydrogen atom or a hydrocarbon group having 1 to 8 carbons that may include a heteroatom; however, the $R^7$ moiety is absent if Q is an oxygen or a sulfur atom).

4. The electrolyte for a photoelectric conversion element according to claim 3, wherein the ionic liquid (A) comprises iodine ions as anions.

5. The electrolyte for a photoelectric conversion element according to claim 1, wherein the other carbon material (C) includes at least the carbon material displaying a pH of from 2 to 6, and a primary average particle size of the carbon material displaying a pH of from 2 to 6 is from 0.010 to 0.050 µm.

6. The electrolyte for a photoelectric conversion element according to claim 1, wherein a total content of the carbon material (B) and the other carbon material (C) is from 10 to 50 parts by mass per 100 parts by mass of the ionic liquid (A).

7. The electrolyte for a photoelectric conversion element according to claim 1 that is prepared by: obtaining a dispersion by mixing the ionic liquid (A) and the other carbon material (C), and then mixing in the carbon material (B).

8. The electrolyte for a photoelectric conversion element according to claim 1 further comprising a silicon oxide and/or a metal oxide.

9. A photoelectric conversion element comprising a photoelectrode including a transparent conductive film and a metal oxide semiconductor porous film;
a counterelectrode disposed opposite the photoelectrode; and
an electrolyte layer disposed between the photoelectrode and the counterelectrode, wherein the electrolyte layer is the electrolyte for a photoelectric conversion element according to claim 1.

10. A dye-sensitized solar cell comprising the photoelectrode according to claim 9 carrying a photosensitized dye.

11. The electrolyte for a photoelectric conversion element according to claim 1, wherein an specific resistance of the carbon material (B) is from $1\times10^{-4}$ to $5\times10^{2}$ Ω·cm.

12. The electrolyte for a photoelectric conversion element according to claim 1, wherein the other carbon material (C) is the boron-modified acetylene black.

13. The electrolyte for a photoelectric conversion element according to claim 1, wherein the other carbon material (C) is a combination of the boron-modified acetylene black and the carbon material displaying a pH of from 2 to 6.

14. The electrolyte for a photoelectric conversion element according to claim 8, wherein a total content of the silicon oxide and/or the metal oxide, the carbon material (B), and the other carbon material (C) is from 10 to 50 parts by mass per 100 parts by mass of the ionic liquid (A).

15. The electrolyte for a photoelectric conversion element according to claim 8, wherein a content ratio of the silicon oxide and/or the metal oxide to the carbon material (B) and the other carbon material (C) is from 1/99 to 50/50.

* * * * *